United States Patent [19]
Katz

[11] Patent Number: 5,535,439
[45] Date of Patent: Jul. 9, 1996

[54] CELLULAR TELEPHONE AND MARINE BAND USER'S PROTECTIVE DEVICE

[76] Inventor: Joseph M. Katz, 11 Meadow Rd., Old Westbury, N.Y. 11568

[21] Appl. No.: 285,798

[22] Filed: Aug. 4, 1994

Related U.S. Application Data

[63] Continuation-in-part of Ser. No. 13,399, Feb. 4, 1993, Pat. No. 5,336,896.

[51] Int. Cl.[6] .............................. H01Q 11/12; H01B 1/04
[52] U.S. Cl. .......................... 455/117; 455/128; 455/129; 455/90
[58] Field of Search .............................. 455/33.1, 89, 90, 455/117, 128, 129, 97, 347, 350, 351; 379/428, 430, 433, 437, 440; 343/702, 713, 877

[56] References Cited

U.S. PATENT DOCUMENTS

| | | | |
|---|---|---|---|
| 4,047,109 | 9/1977 | Sekiguchi | 455/6.3 |
| 4,658,439 | 4/1987 | Danielsen et al. | 455/90 |
| 4,872,022 | 10/1989 | Schock | 343/806 |
| 5,389,942 | 2/1995 | Oglesby, Jr. | 343/713 |

*Primary Examiner*—Reinhard J. Eisenzopf
*Assistant Examiner*—Marsha D. Banks-Harold
*Attorney, Agent, or Firm*—Dilworth & Barrese

[57] ABSTRACT

An accessory for cellular telephones or marine band telephones that will afford some protection to cellular telephone and marine band telephone users from the alleged brain, head and body damage caused by electro-magnetic radiation and microwave radiation of cellular telephone use or marine band use and to also provide a comfortable handle when using and carrying the cellular telephone or marine band telephone.

15 Claims, 6 Drawing Sheets

CELLULAR TELEPHONE AND MARINE BAND USER'S PROTECTIVE DEVICE

This is a continuation-in-part of application Ser. No. 08/013,399 filed Feb. 4, 1993 now U.S. Pat. No. 5,336,896, claiming priority from that application and any of its parent applications.

This Continuation in Part Application to U.S. Pat. No. 5,336,896 expands on the uses that apply to the invention and to be responsive to the variety and differences of cellular telephones and to adjust the invention to fit cellular and marine band telephone manufacturing companies varied specifications, to broaden the versatility and ease of use of the invention, to provide a means to use the latest materials and technology in this fast moving and expanding field of cellular and marine band telephone use.

BACKGROUND OF THE INVENTION

1. Field of the Invention

The invention relates to providing some protection to the users of cellular and marine band telephones from the electro-magnetic fields radiation and microwave radiation emitted therefrom.

2. Description of the Prior Art

Cellular Telephone Users Protective Device by Joseph M. Katz, U.S. Pat. No. 5,336,896.

SUMMARY OF THE INVENTION

There is much concern throughout the world that electro-magnetic fields radiation and microwave radiation can cause body injury, brain damage, cancer, genetic defects, etc.

The antennas and body of Cellular Telephones and Marine Band Telephones come in close contact with a persons head thereby creating a close exposure to electro-magnetic and microwave radiation.

Because of these hazards and to offer some protection against these hazards this device was invented.

It is a simple and lightweight device. It consists of a lightweight jacket that completely encases the telephone. The jacket's interior is completely lined with electro-magnetic and microwave shielding to attenuate the radiation. A swivel, tilt and telescope antenna is attached to the jacket thereby permitting the user to tilt, swivel and telescope the antenna away from their head, thereby putting distance from the head from the receiving and transmission radiation from the antenna. There is a handle attached to the jacket for comfort when using the telephone and the handle can be slipped onto a belt or pocket for convenience when carrying the telephone.

It is simple to install onto the telephone. The front of the jacket opens like a book, the telephone is placed into the jacket and the telephone's antenna is fastened to a clipping device within the jacket thereby forming a circuit with the jacket's outside antenna. In some cases, depending upon the telephone's type of antenna, the telephone's antenna is removed from the telephone and an alternate device substituted, which device is connected to the jackets clipping device to form the circuit continuity. The open jacket is closed and a tab holds and seals the unit until it is ready for use.

It is simple to operate the telephone. The tab is opened and the jacket opened like a book, this exposes the telephone's keyboard. The opposite party's telephone number is dialed and when the connection is made the user simply closes the jacket and tab, adjusts the telescoping, swivel and tilt antenna of the jacket for maximum distance away from the head and for acoustical performance, talks and listens through the holes in the jacket. When the conversation is finished, the antenna is readjusted to fold down carry position and is ready for carry purposes.

The invention includes various types of antennas for different purposes all of which can be substituted for the simple telescope, swivel and tilt type. One is the accordian type, which permits the user to adjust the antenna at an additional angle away from the telephone for additional distance from the telephone. Another is the removable antenna which permits removing the antenna from the telephone and attaching it to a hard surface with the suction cup attachment. All of these antennas are of the swivel, tilt and telescope type to afford maximum adjustments as desired by the operator. The purpose of these additional antennas is to afford maximum protection by distancing the antenna from the head.

There are some telephone's that are manufactured that have a flip door covering the dialing mechanism. To provide protection for these types of telephone, a jacket similar to the one noted above is made with an additional door and closing flap at the bottom of the jacket. When the operator wants to use this type of telephone, they simply open the jacket booklike, open the bottom flap and door to permit the telephone's flip door to be opened. The user dials the wanted number and when the connection is made simply closes the jacket leaving the bottom flap open so that the flip door is exposed for speaking into. When the conversation is finished the user simply opens the jacket and folds up the flip door, closes jacket doors and the unit is ready for carry.

To build the invention a flexible material such as plastic, leather or vinyl is used for the jacket, doors and flaps. An electro-magnetic and microwave shielding is fastened to the inner side of the material. The shielding material can be such as produced by MONSANTO called FLECTRON. The combined material is then formed into a jacket that will totally encase the cellular or marine band telephone. It can open booklike with the full length tab on one side that effects a seal when closed.

Some models will also have a door at the bottom of the jacket, with a sealing tab, to permit the flip type door telephone to be opened and used.

A telescoping, swivel and tilt antenna or a swivel, tilt and telescoping antenna with additional angles or a removable swivel, tilt and telescoping antenna with wire and a suction cup for removing and replacing the antenna on a hard surface is attached to an electro-magnetic and microwave radiation shielded connector attached to the jacket. The connector can be of the alligator clip type or any of the other grip types that can grasp the telephone's antenna and form a circuit.

DESCRIPTION OF THE PREFERRED EMBODIMENTS

Figure 1:
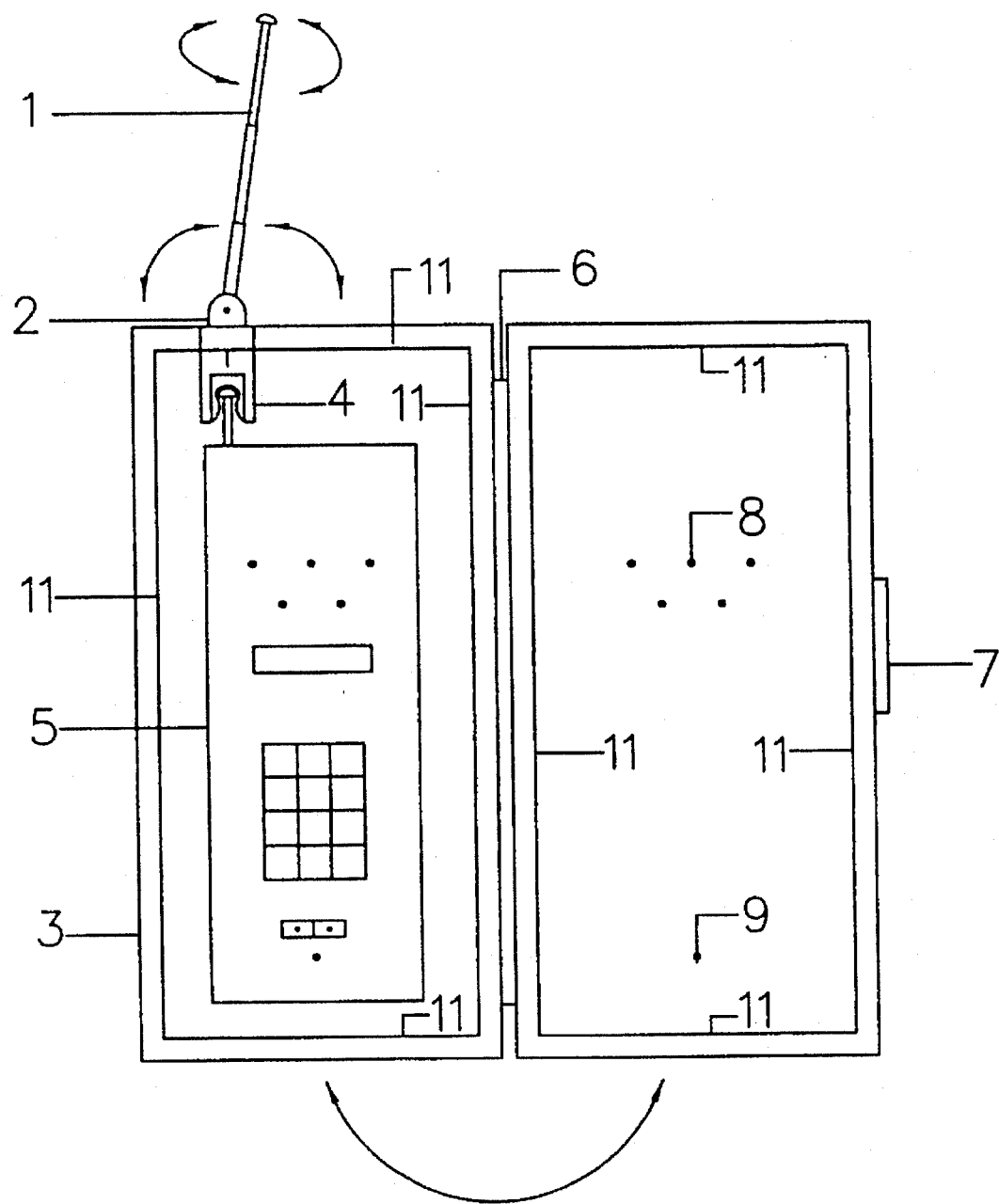
FIG. 1 is a model of the invention that accomodates a straight line telephone. It shows the jacket open with a telephone inserted therein.
Figure 2:
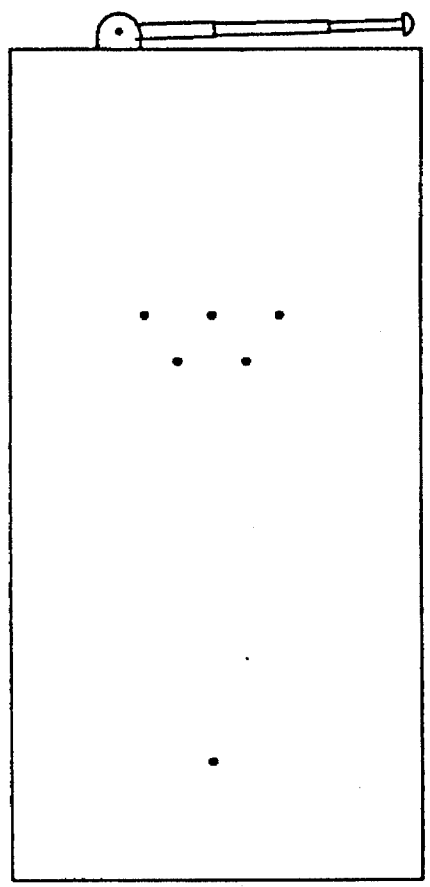
FIG. 2 shows the invention with the case closed.
Figure 3:
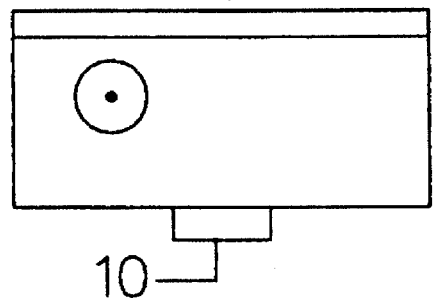
FIG. 3 shows the top view.
Figure 4:
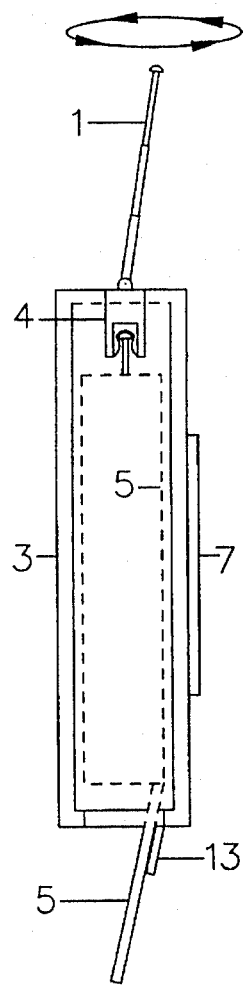
FIG. 4 shows a side view of a model to accomodate the flip door type telephone like Motorola, with telephone installed in the jacket, ready talkl into and receive messages.
Figure 5:
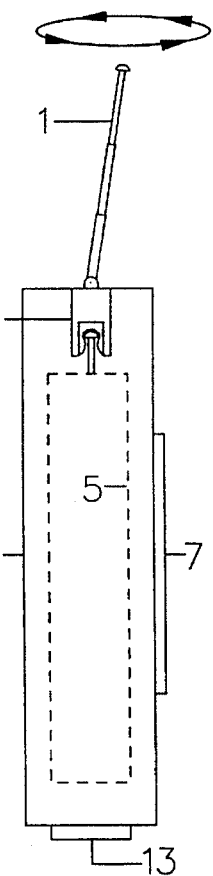
FIG. 5 shows a side view of the FIG. 4 model, with telephone installed when not being used.
Figure 6:
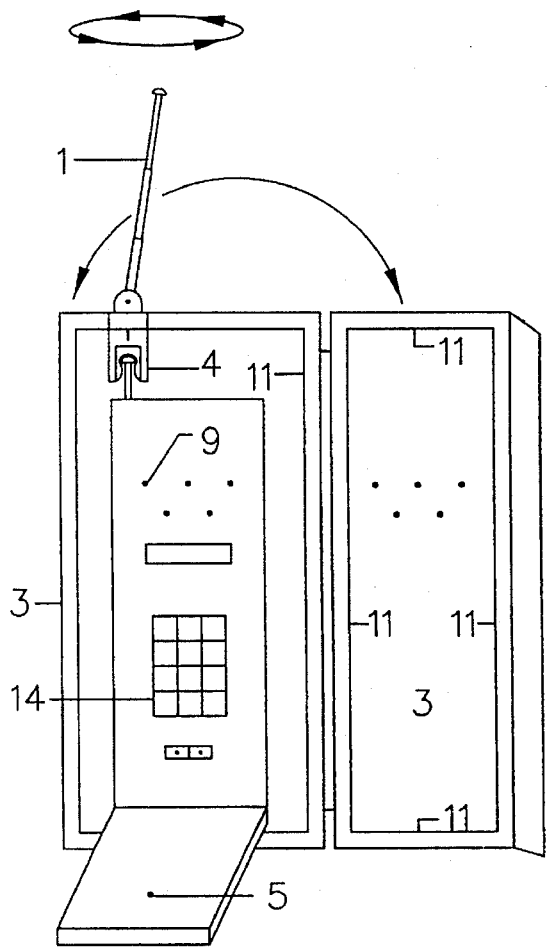
FIG. 6 shows the FIG. 4 model with jacket opened and telephone installed, ready to dial calling numbers.
Figure 7:
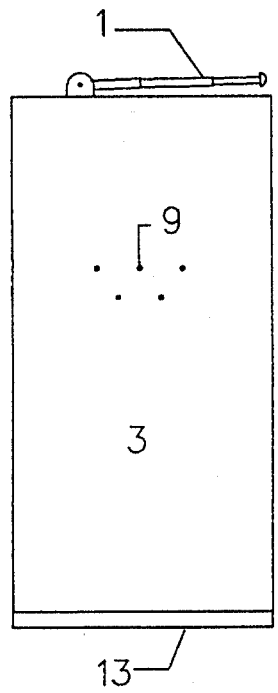
FIG. 7 shows front view if FIG. 4 model with doors closed.
Figure 8:
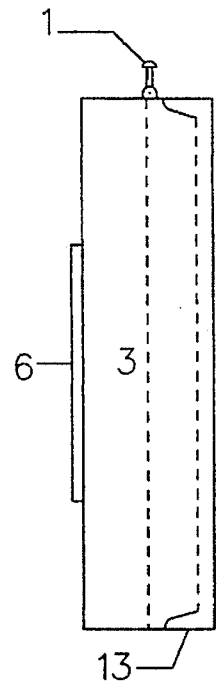
FIG. 8 shows side view of FIG. 4 model with doors closed.
Figure 9:
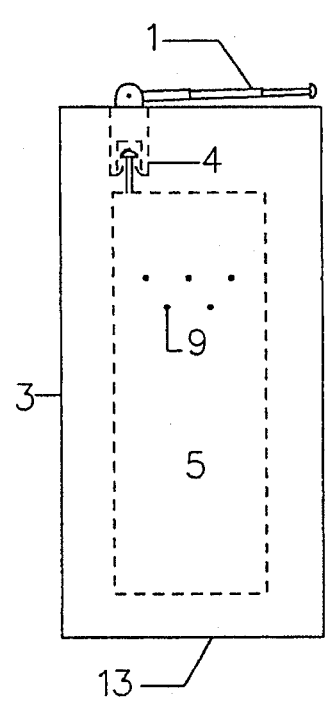
FIG. 9 shows front view of front view of FIG. 4 model with doors closed and telephone installed therein.
Figure 10:
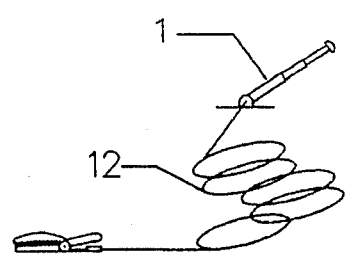
FIG. 10 shows a wired alligator clip connector attached to the tilt, telescope and swivel antenna.
Figure 11:
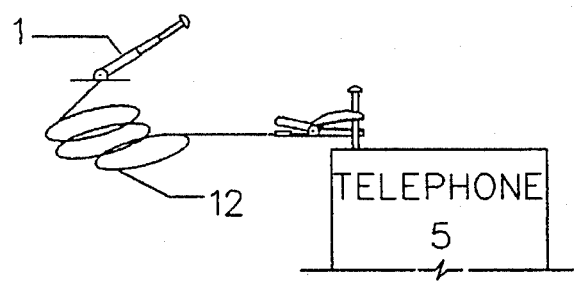
FIG. 11 shows the alligator connector fastened to the telephone antenna for a circuit.
Figure 12:
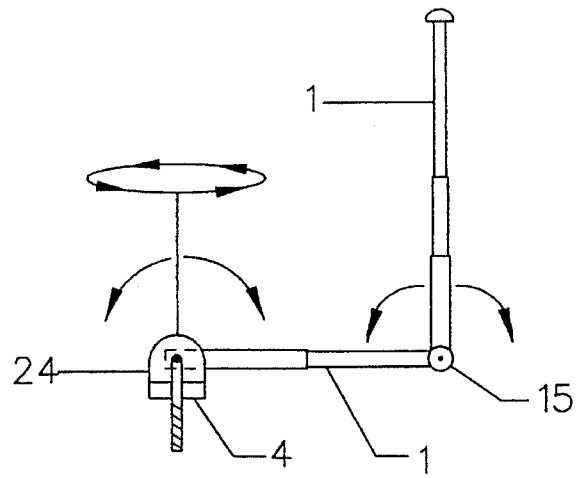
FIG. 12 shows the alligator type swivel, telescope and double tilt antenna and connector.
Figure 13:
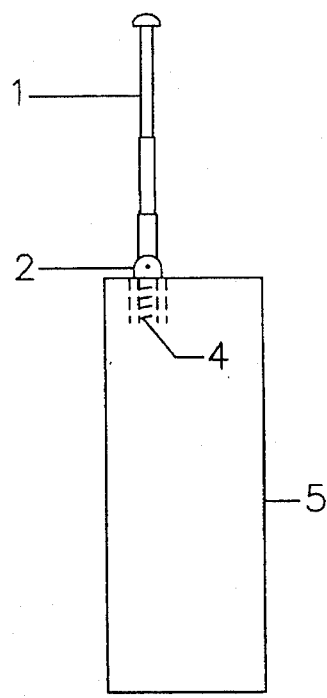
FIG. 13 shows a flip door telephone with the door closed.
Figure 14:
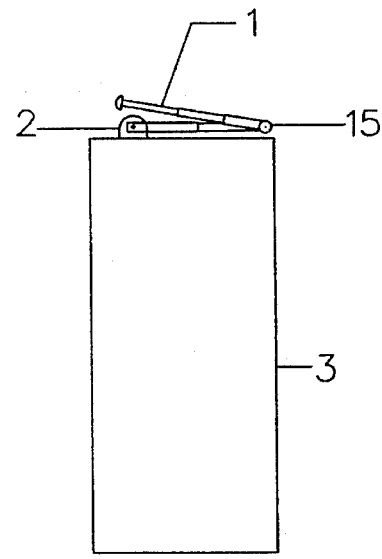
FIG. 14 shows the alligator type telescope, swivel and double tilt antenna affixed to the invention.
Figure 15:
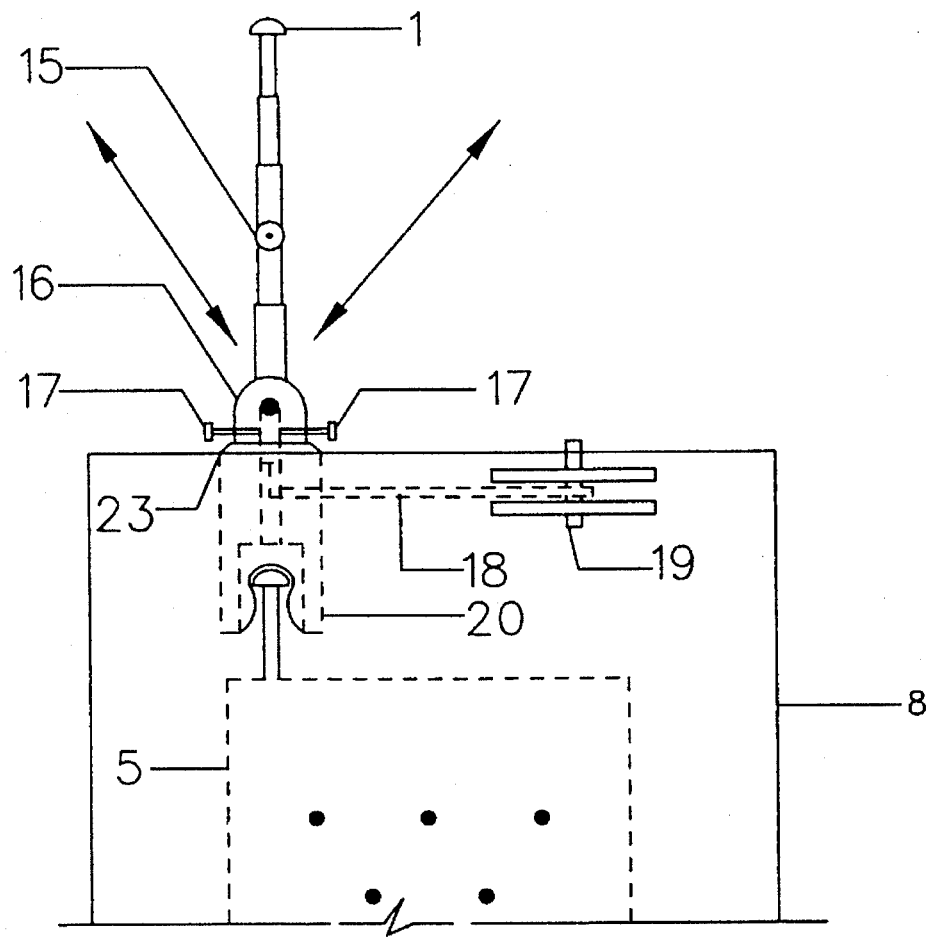
FIG. 15 shows the removable type tilt, swivel and telescope antenna attached to a telephone within the jacket with antenna wire slack wound on a rotating spool showing pressure disconnects to release the wired antenna from the jacket for placing the antenna at another location.
Figure 16:
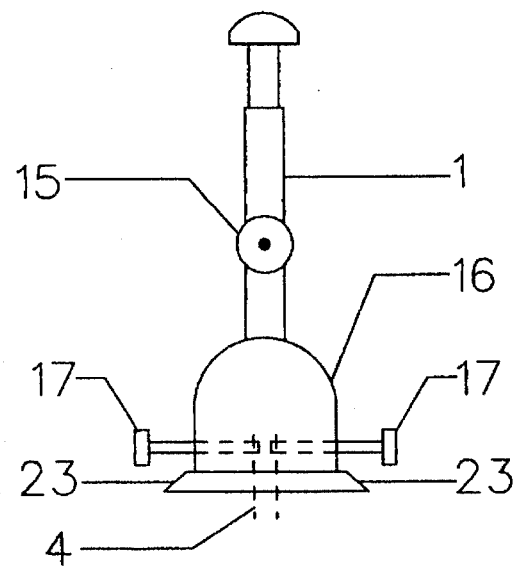
FIG. 16 shows an expanded view of the antenna pressure disconnects with suction cup at base of antenna connector.

There are various models of the invention to suit the needs of the consumer and to conform to the various types of cellular and marine band telephones. To accomodate the various types of telephone and consumer uses it is necessary to provide various models and accessories, which are described in FIGS. 1 through FIGS. 16.

The parts of the invention as described in the drawings are the tilt, swivel and telescoping antenna 1, tilt and swivel EMI shielded 2, EMI & Microwave shielded protective jacket 3, antenna connector 4, cellular or marine band telephone 5, hinge 6, handle 7, listening holes 8, speaking holes 9, carrying handle 10, radiation shielding 11, wired alligator clamp connector 12, door 13, dialing buttons 14, tilt connector 15, swivel connector 16, disconnect pins 17, antenna wire 18, antenna wire winding spool 19, antenna gripper 20, wire connector 21, disconnect pin grooves 22, suction cup 23, tilt swivel connector 24.

While various changes may be made in the detailed construction, such changes will be within the spirit and scope of the present invention, as defined by the appended claims.

I claim:

1. An assembly for attenuating the passage of electromagnetic and microwave radiation emitted from cellular and marine band telephones, said assembly comprising:

a) a box including at least two portions and having four sides, a top and a bottom, said at least two box portions being hinged such that said box portions are movable between open and closed positions to open and close the box, said box being configured to receive a cellular or marine band telephone therein;

b) electromagnetic and microwave radiation shielding affixed to the inside of said four sides, said top and said bottom;

c) a handle mounted to an outside of said box, said handle behag positoned to facilitate carrying said assembly;

d) a telescoping antenna connected to a tilt and swivel base connector, said base connector being attached to at least one of said at least two box portions and penetrating therethrough and said electromagnetic and microwave radiation shielding, said tilt and swivel base connector being connected to an antenna connector positioned within said box and said electromagnetic and microwave shielding to form an antenna circuit; and e) at least one hole being provided through said box and said shielding for talking into and listening from said cellular or maxine band telephone.

2. An assembly according to claim 1 further comprising an opening in one of said sides, and a door movably mounted adjacent to said opening between open and closed positions, wherein said opening is dimensioned to receive a flip open door of a cellular or marine band telephone.

3. An assembly for effecting antenna circuitry from a tilt and swivel base connector on the outside of a box to a cellular or marine band telephone installed within said box comprising:

a) an alligator clip conenctor attached to a wire, said wire being attached to the tilt and swivel base connector and said alligator clip connector being attached to the antenna circuitry of the cellular or marine band telephone; and b) a suction cup attached to said tilt and swivel base connector, the suction cup being used to attach said tilt and swivel base connector to another object while remaining affixed to the telephone antenna circuitry encased in the box.

4. An assembly according to claim 3 further comprising a wired spool, and wherein said wire is wound on said spool and may be unwound to facilitate relocation of said tilt and swivel base connector.

5. An assembly for attenuating the transmission of electro-magnetic radiation emitted from a hand-held self-contained two-way personal voice communication device to a user's head, said assembly comprising:

a housing having a plurality of surfaces including four sides, a top, and a bottom;

one of the four sides having a mouthpiece means for talking, proximal to the bottom, and an earpiece means for listening, proximal to the top; antenna means having a tip distal from a base;

said antenna means connected at its base to a tilt and swivel base connector means for adjusting a position of the tip to a maximum distance from the user's head, and for the antenna means thus radiating primarily away from the user's head;

said tilt and swivel base connector means further for attaching to an antenna-mount surface of the plurality of surfaces of the housing, said antenna-mount surface not being the mouthpiece-earpiece side.

6. An assembly according to claim 5 in which the antenna means telescopes.

7. An assembly for attenuating the transmission of electro-magnetic radiation emitted from a hand-held self-contained two-way personal voice communication device according to claim 4, wherein said antenna means includes a mount extending therefrom adapted to mount said antenna directly to an antenna receiving portion of the personal voice communication device.

8. An assembly for attenuating passage of electromagnetic and microwave radiation, said assembly comprising:

a housing having enclosed sidewalls, a top wall and a bottom wall, said top wall being movably connected to said sidewalls between open and closed positions, said housing defining a space dimensioned to receive a telephone;

radiation shielding affixed to inner walls of said housing;

an antenna attached to a said sidewall of said housing; and an antenna connector positioned within said housing and being configured to engage antenna circuitry of the telephone, said antenna connector being in electrical communication with said antenna;

wherein said housing has at least one hole to facilitate communicating via the telephone.

9. An assembly according to claim 8 further comprising a tilt and swivel base connector interconnecting said antenna and said antenna connector, said tilt and swivel base connector being secured to an outer surface of said housing.

10. An assembly according to claim 9 wherein the antenna includes at least one telescoping section.

11. An assembly according to claim 10 wherein said at least one telescoping section includes first and second telescoping sections, said first and second telescoping sections being interconnected by a tilt connector.

12. An assembly according to claim 8 further comprising a handle connected to said housing to facilitate carrying of said assembly.

13. An assembly according to claim 8 further comprising a wire interconnecting the antenna and the antenna connector, and a suction cup mounted to the antenna, said wire being of a length to permit repositioning of the antenna to a location remote from said housing.

14. An assembly according to claim 13 wherein said wire is wound about a spool and said wire may be unwound from said spool to relocate said antenna.

15. An assembly according to claim 8 further comprising an opening in one of said sidewalls and a door positioned adjacent said opening, said door being movable between open and closed positions to open and close said opening, wherein said opening is configured to receive a flip open door of a telephone.

* * * * *